(12) United States Patent
Lin et al.

(10) Patent No.: US 12,159,786 B2
(45) Date of Patent: Dec. 3, 2024

(54) SEMICONDUCTOR DEVICE AND METHOD OF MANUFACTURING THE SAME

(71) Applicant: NANYA TECHNOLOGY CORPORATION, New Taipei (TW)

(72) Inventors: Kai Hung Lin, Taichung (TW); Cheng Yan Ji, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 398 days.

(21) Appl. No.: 17/659,013

(22) Filed: Apr. 13, 2022

(65) Prior Publication Data

US 2023/0335395 A1 Oct. 19, 2023

(51) Int. Cl.
*H01L 21/02* (2006.01)

(52) U.S. Cl.
CPC .. *H01L 21/02274* (2013.01); *H01L 21/02112* (2013.01)

(58) Field of Classification Search
CPC ......... H01L 21/02274; H01L 21/02112; H01L 21/0243; H01L 21/0245; H01L 21/02505; H01L 21/02576; H01L 21/0262; H01L 21/76877; H01L 21/02532; H01L 29/401; H01L 29/4236; H01L 29/42372
USPC ........................................ 257/758
See application file for complete search history.

(56) References Cited

U.S. PATENT DOCUMENTS 5,231,052 A 7/1993 Lu et al.
2020/0395477 A1* 12/2020 Li .................. H01L 29/785

FOREIGN PATENT DOCUMENTS

TW 468263 B 12/2001

* cited by examiner

*Primary Examiner* — Tong-Ho Kim
(74) *Attorney, Agent, or Firm* — CKC & Partners Co., LLC

(57) ABSTRACT

The present disclosure provides a method of manufacturing a semiconductor device. The method includes: depositing a first semiconductor layer on an inner surface of a trench of a substrate; depositing a second semiconductor layer on the first semiconductor layer on the inner surface of the trench of the substrate, in which a dopant concentration of the first semiconductor layer is less than a dopant concentration of the second semiconductor layer; and depositing a third semiconductor layer on the second semiconductor layer to fill the trench of the substrate, in which a dopant concentration of the third semiconductor layer is less than the dopant concentration of the second semiconductor layer.

18 Claims, 13 Drawing Sheets

SEMICONDUCTOR DEVICE AND METHOD OF MANUFACTURING THE SAME

BACKGROUND

Field of Invention

The present invention relates to a semiconductor device and a method of manufacturing the same.

Description of Related Art

With the evolution of generations and the shrinking of semiconductor processes, there will be challenges of trench filling process due to the minimization of a semiconductor device. For example, one of the related challenges brought by the semiconductor device is that the process of using doped polysilicon to fill the trench which becomes smaller and deeper is prone to produce a so-called poly seam depending on the way doped-polysilicon grows and the grain size. The poly seam often becomes a poly void due to the thermal effect of subsequent related processes. Such poly seam and poly void are likely to cause resistance variation and a decrease in the breakdown voltage in subsequent related processes, thereby reducing the performance of the entire semiconductor device.

SUMMARY

In view of this, one purpose of present disclosure is to provide a semiconductor device and a method of manufacturing the same that can solve the aforementioned problems.

In order to achieve the above objective, according to an embodiment of the present disclosure, a method of manufacturing a semiconductor device includes: depositing a first semiconductor layer on an inner surface of a trench of a substrate; depositing a second semiconductor layer on the first semiconductor layer on the inner surface of the trench of the substrate, wherein a dopant concentration of the first semiconductor layer is less than a dopant concentration of the second semiconductor layer; and depositing a third semiconductor layer on the second semiconductor layer to fill the trench of the substrate, wherein a dopant concentration of the third semiconductor layer is less than the dopant concentration of the second semiconductor layer.

In one or more embodiments of the present disclosure, in which a material of the third semiconductor layer is identical to a material of the first semiconductor layer.

In one or more embodiments of the present disclosure, in which a material of the third semiconductor layer is different from a material of the second semiconductor layer.

In one or more embodiments of the present disclosure, in which the depositing the first semiconductor layer and the depositing the second semiconductor layer are iteratively performed.

In one or more embodiments of the present disclosure, in which the depositing the third semiconductor layer is performed after the depositing the first semiconductor layer and the depositing the second semiconductor layer.

In one or more embodiments of the present disclosure, in which the depositing the first semiconductor layer is performed by a blanket deposition process.

In one or more embodiments of the present disclosure, in which a material of the first semiconductor layer includes phosphorous-doped polysilicon.

In one or more embodiments of the present disclosure, in which a material of the first semiconductor layer includes non-doped polysilicon.

In one or more embodiments of the present disclosure, in which the depositing the second semiconductor layer is performed by a blanket deposition process.

In one or more embodiments of the present disclosure, in which a material of the second semiconductor layer includes phosphorous-doped polysilicon.

In one or more embodiments of the present disclosure, in which the depositing the third semiconductor layer is performed by a blanket deposition process.

In one or more embodiments of the present disclosure, in which a material of the third semiconductor layer includes phosphorous-doped polysilicon.

In one or more embodiments of the present disclosure, in which a material of the third semiconductor layer includes non-doped polysilicon.

According to an embodiment of the present disclosure, a semiconductor device includes a first semiconductor layer, a second semiconductor layer, and a third semiconductor layer. The first semiconductor layer is disposed on an inner surface of a trench of a substrate, in which an aspect ratio of a depth to a width of the trench is greater than 1, and the width is less than 60 nanometers. The second semiconductor layer is disposed on the first semiconductor layer in the inner surface of the trench of the substrate, in which a dopant concentration of the first semiconductor layer is less than a dopant concentration of the second semiconductor layer. The third semiconductor layer is disposed on the second semiconductor layer, in which a dopant concentration of the third semiconductor layer is less than the dopant concentration of the second semiconductor layer, and in which the third semiconductor layer fully fills the trench of the substrate.

In one or more embodiments of the present disclosure, in which a material of the first semiconductor layer and a material of the third semiconductor layer are identical.

In one or more embodiments of the present disclosure, in which a material of the second semiconductor layer is different from a material of the third semiconductor layer.

In one or more embodiments of the present disclosure, in which the first semiconductor layer and the second semiconductor layer are iteratively formed in the trench of the substrate.

In one or more embodiments of the present disclosure, in which the first semiconductor layer, the second semiconductor layer, and the third semiconductor layer are concentrically arranged in the trench of the substrate in a top view.

In one or more embodiments of the present disclosure, in which the second semiconductor layer wraps the third semiconductor layer, and the first semiconductor layer wraps the second semiconductor layer and the third semiconductor layer.

In one or more embodiments of the present disclosure, in which a material of the first semiconductor layer and a material of the third semiconductor layer include non-doped polysilicon.

In summary, in the semiconductor device and the method of manufacturing the same of present disclosure, since the steps of deposition to fill the trench are split into several steps, the time duration of process gas flow may be reduced, thereby lowering down the difficulty of the quality control of the filled material. In the semiconductor device and the method of manufacturing the same of present disclosure, since each of the doped semiconductor layers is sandwiched between the non-doped semiconductor layers (or, sandwiched between the less-doped semiconductor layers), the poly seam that may be generated in doped semiconductor layers may be restricted in certain areas, thereby reducing the probability of generating poly void, and reducing resistivity and improving its electrical performance.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
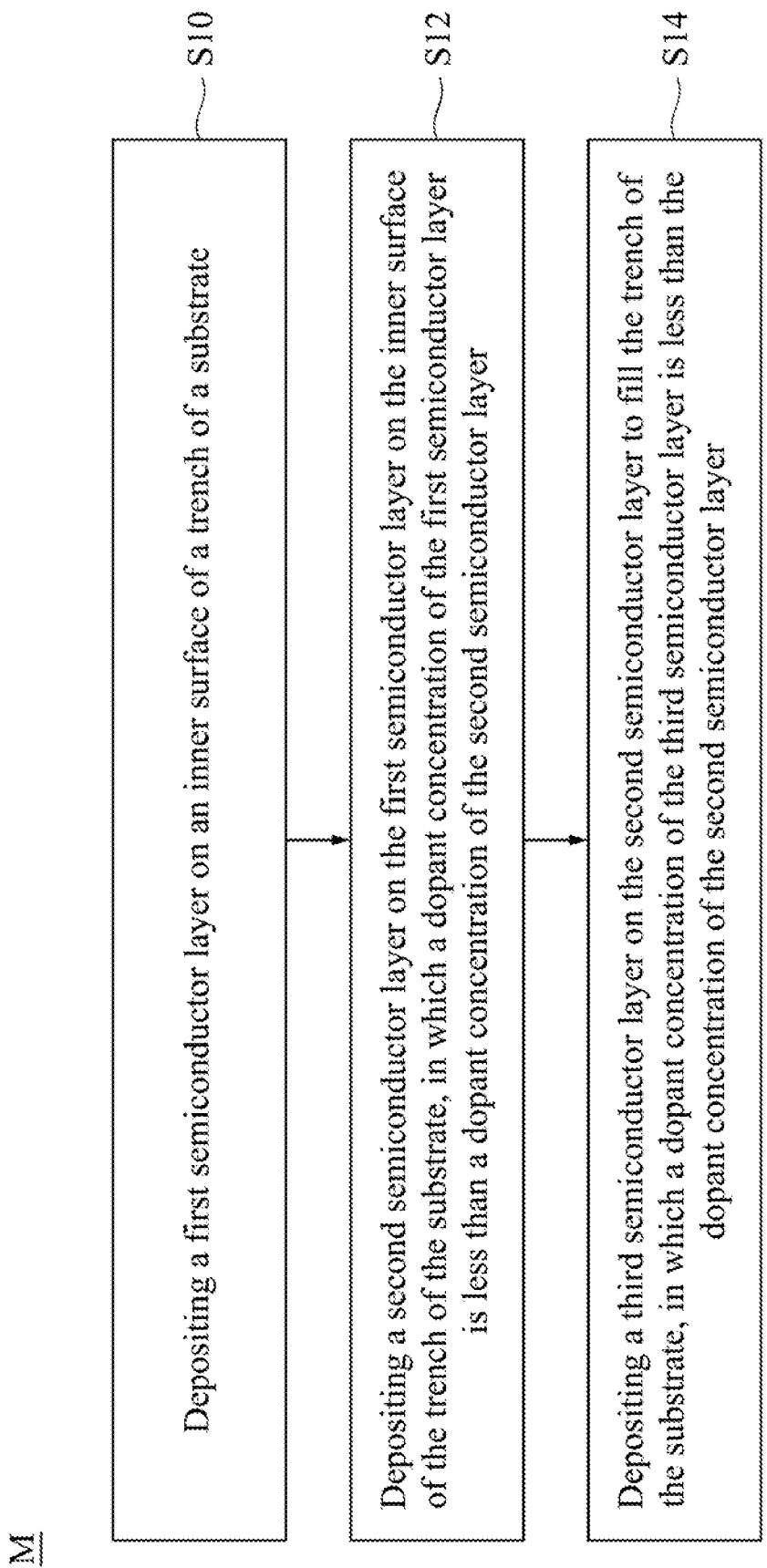
FIG. 1 is a flow chart of a method of manufacturing a semiconductor device in accordance with an embodiment of present disclosure.

Reference will now be made in detail to the present embodiments of the invention, examples of which are illustrated in the accompanying drawings. Wherever possible, the same reference numbers are used in the drawings and the description to refer to the same or like parts.

Figure 8:
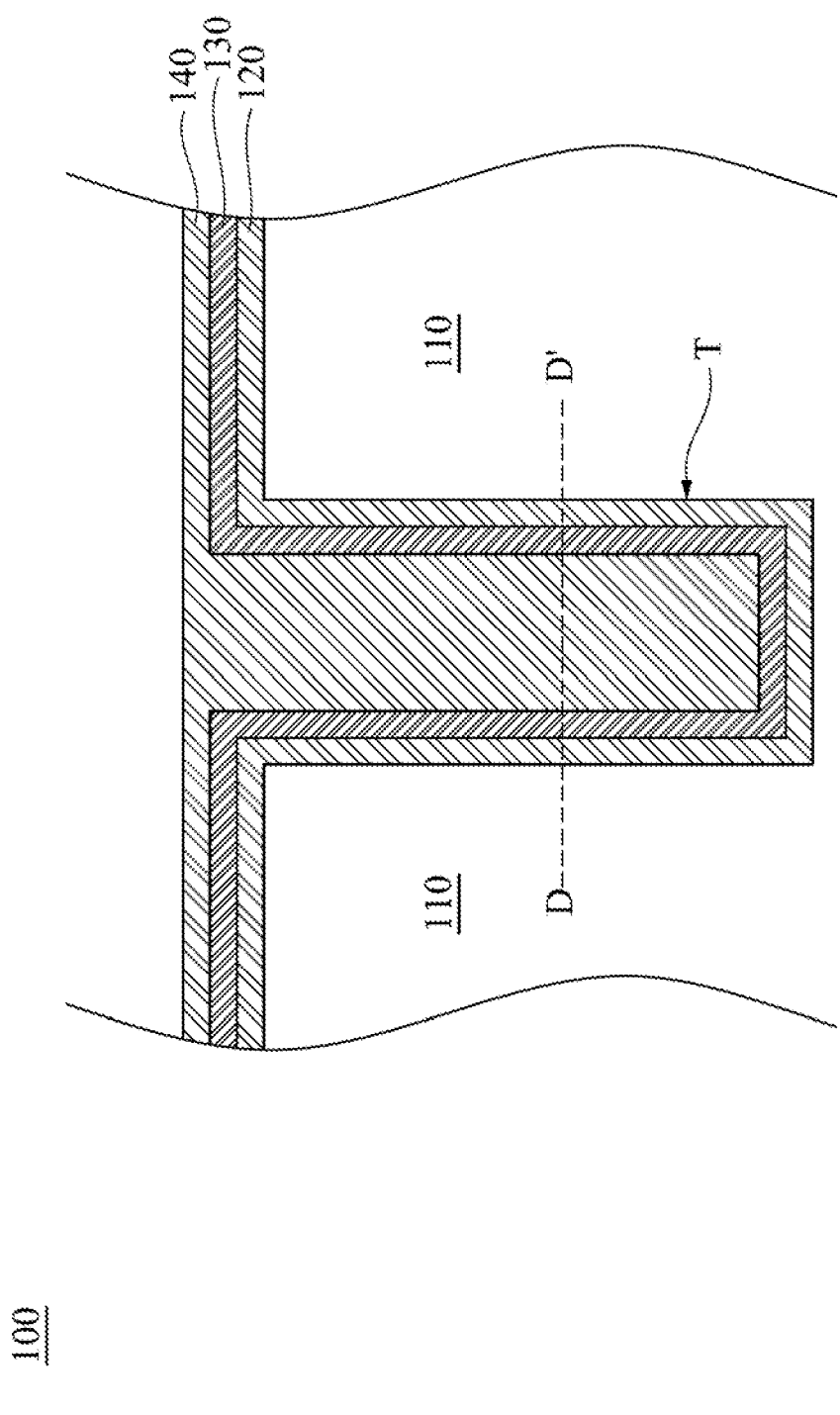
FIG. 8 is a cross-sectional view of an intermediate stage of manufacturing the semiconductor device in accordance with an embodiment of present disclosure.
Figure 9:
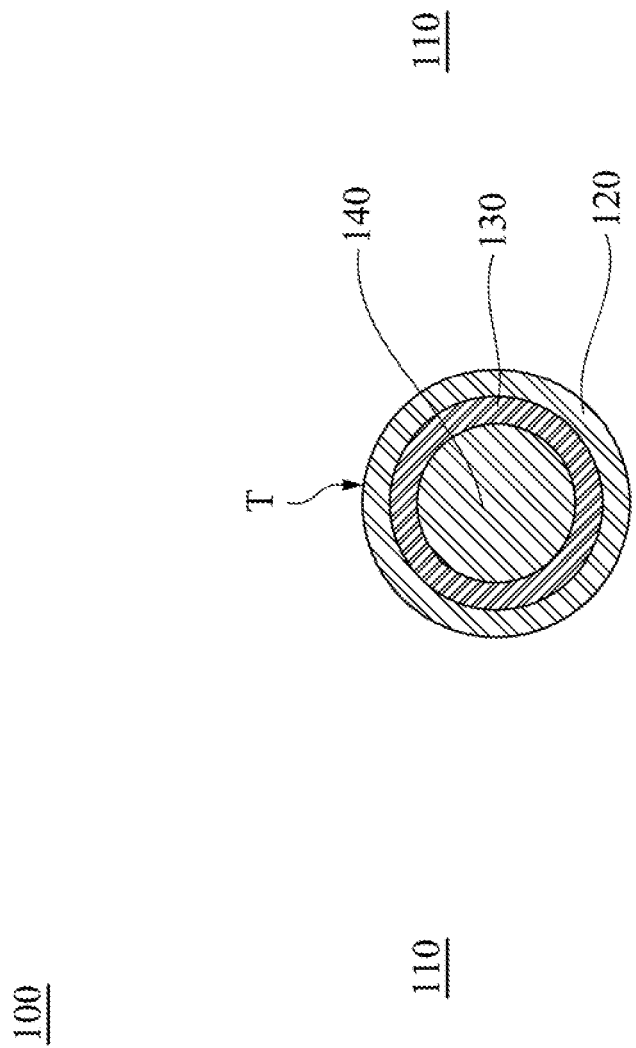
FIG. 9 is a cross-sectional view of an intermediate stage of manufacturing the semiconductor device in accordance with an embodiment of present disclosure.

Reference is made to FIG. 1. FIG. 1 is a flow chart of a method M of manufacturing a semiconductor device 100 as shown in FIG. 8 and FIG. 9 in accordance with an embodiment of present disclosure. The method M shown in FIG. 1 includes a step S10, a step S12, and a step S14. Please refer to FIG. 1, FIG. 2, FIG. 3, FIG. 4, and FIG. 5 for better understanding the step S10, refer to FIG. 1, FIG. 6, and FIG. 7 for better understanding the step S12, and refer to FIG. 1, FIG. 8, and FIG. 9 for better understanding the step S14.

Figure 2:
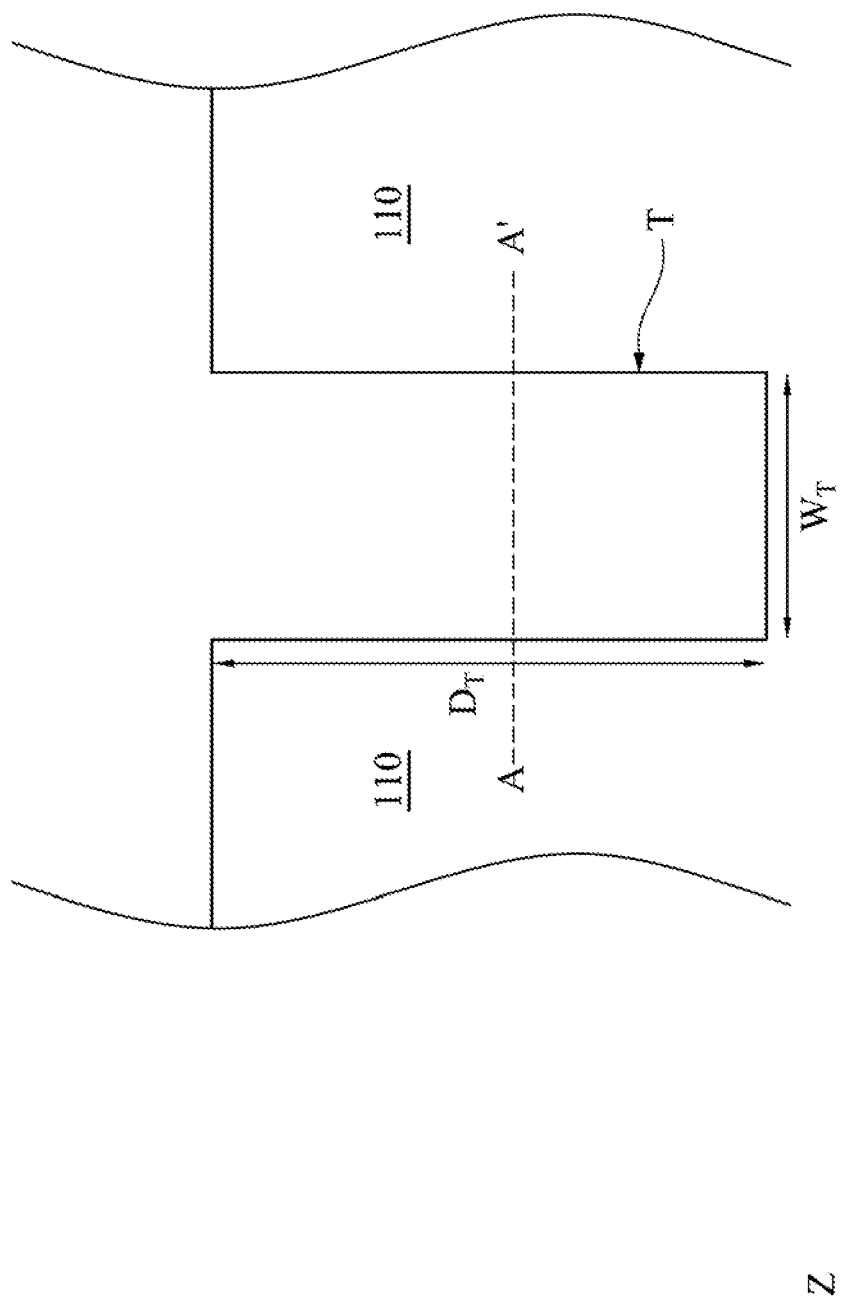
FIG. 2 is a cross-sectional view of an intermediate stage of manufacturing a semiconductor device in accordance with an embodiment of present disclosure.

Reference is made to FIG. 2. FIG. 2 is a cross-sectional view of an intermediate stage of manufacturing a semiconductor device 100 in accordance with an embodiment of present disclosure. As shown in FIG. 2, a substrate 110 is provided. The substrate 110 includes a trench T which is recessed from a top surface of the substrate 110. As shown in FIG. 2, the trench T includes a depth DT and a width WT. In some embodiments, an aspect ratio of the depth DT to the width WT of the trench T is greater than about 1, but the present disclosure is not limited thereto. For example, the depth DT may be larger than the width WT. In some embodiments, the width WT is less than about 60 nanometers, but the present disclosure is not limited thereto.

Figure 3:
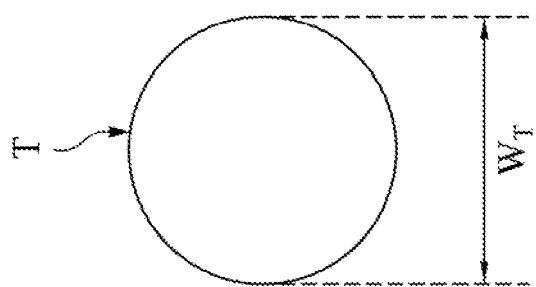
FIG. 3 is a cross-sectional view of an intermediate stage of manufacturing the semiconductor device in accordance with an embodiment of present disclosure.

Reference is made to FIG. 3. FIG. 3 is a cross-sectional view of an intermediate stage of manufacturing a semiconductor device 100 in accordance with an embodiment of present disclosure based on a section A-A' of FIG. 2. In some embodiments, the width WT shown in FIG. 2 may also refer to a diameter of the trench T as shown in FIG. 3. In some embodiments, the trench T may have a circular shape in the section A-A', but the present disclosure is not limited thereto.

In some embodiments, the substrate 110 may include a material, such as silicon oxide ($Si_xO_y$), silicon nitride ($Si_xN_y$), titanium oxide ($Ti_xO_y$), or titanium nitride ($Ti_xN_y$). However, any suitable material may be utilized.

In some embodiments, the substrate 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the substrate 110.

In some embodiments, the trench T may be formed by any suitable method, for example, wet etching, dry etching, or the like. The present disclosure is not intended to limit the methods of forming the trench T.

Step S10, step S12, and step S14 are described in detail below.

In step S10, a first semiconductor layer 120 is deposited on an inner surface of the trench T of the substrate 110.

Figure 4:
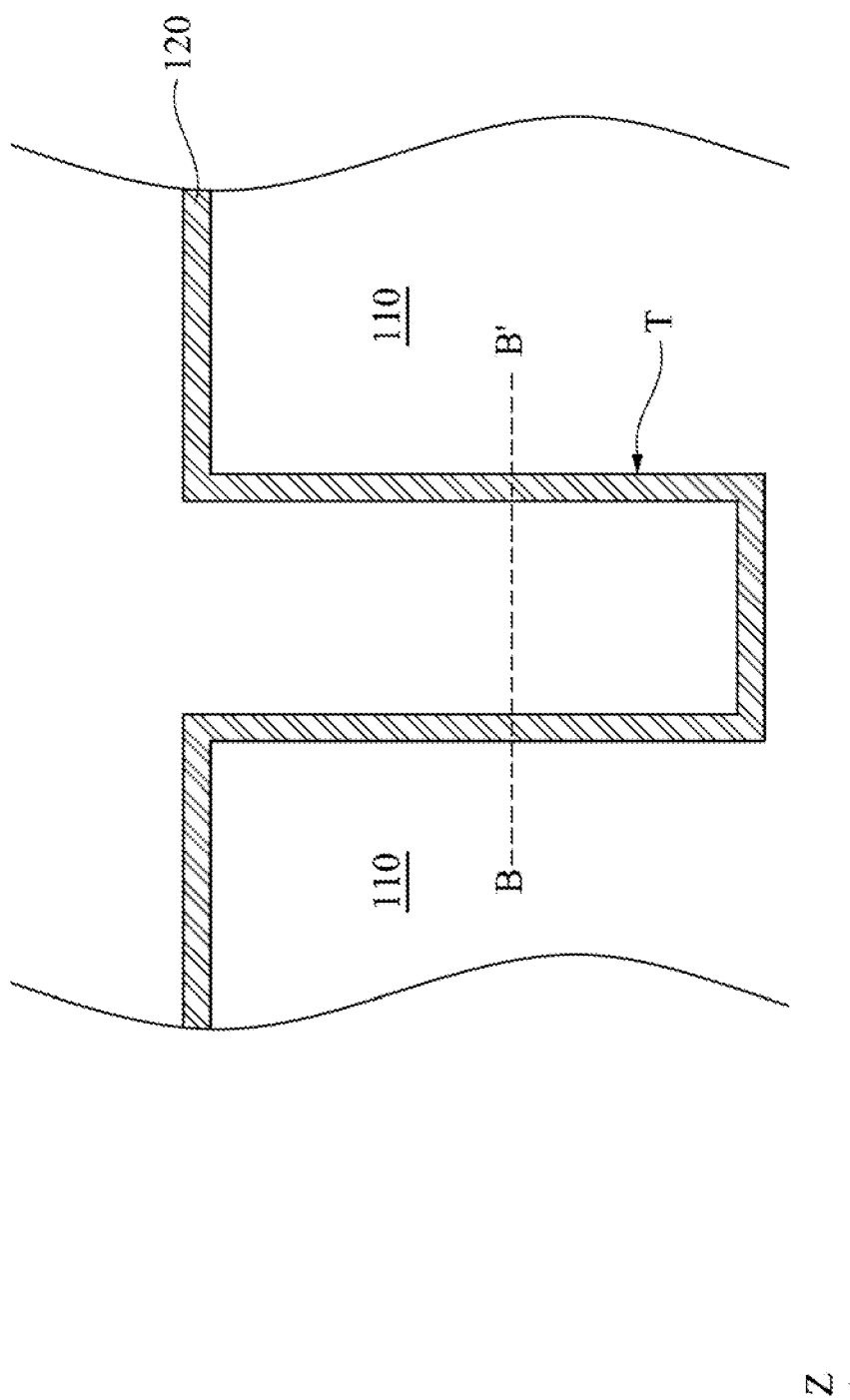
FIG. 4 is a cross-sectional view of an intermediate stage of manufacturing the semiconductor device in accordance with an embodiment of present disclosure.

Reference is made to FIG. 1 and FIG. 4. FIG. 4 is a cross-sectional view of an intermediate stage of manufacturing a semiconductor device 100 in accordance with an embodiment of the present disclosure. As shown in FIG. 4, the first semiconductor layer 120 is formed in step S10. Specifically, the first semiconductor layer 120 is at least deposited on an inner surface of the trench T of the substrate 110. This ensures that the inner surface of the trench T is lined with the first semiconductor layer 120 during the depositing of step S10.

Figure 5:
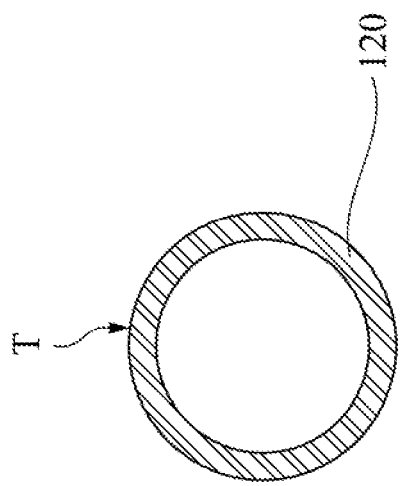
FIG. 5 is a cross-sectional view of an intermediate stage of manufacturing the semiconductor device in accordance with an embodiment of present disclosure.

Reference is made to FIG. 1 and FIG. 5. FIG. 5 is a cross-sectional view of an intermediate stage of manufacturing a semiconductor device 100 in accordance with an embodiment of present disclosure based on a section B-B' of FIG. 4. As shown in FIG. 5, the inner surface of the trench T is lined with the first semiconductor layer 120 with a ring shape (or, a donut shape) in the section B-B', but the present disclosure is not limited thereto.

In some embodiments, the first semiconductor layer 120 is formed on a top surface of the substrate 110, as shown in FIG. 4, but the present disclosure is not limited thereto.

In some embodiments, the first semiconductor layer 120 may include a material, such as non-doped polysilicon. For example, the material may include pure silane ($SiH_4$), disilane ($Si_2H_6$), dichlorosilane ($SiH_2Cl_2$), or the like. However, any suitable material may be utilized.

In some embodiments, the first semiconductor layer 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first semiconductor layer 120.

In some embodiments, the first semiconductor layer 120 may be deposited by a blanket depositing process. The present disclosure is not intended to limit the methods of depositing the first semiconductor layer 120.

In step S12, a second semiconductor layer 130 is deposited on the first semiconductor layer 120.

Figure 6:
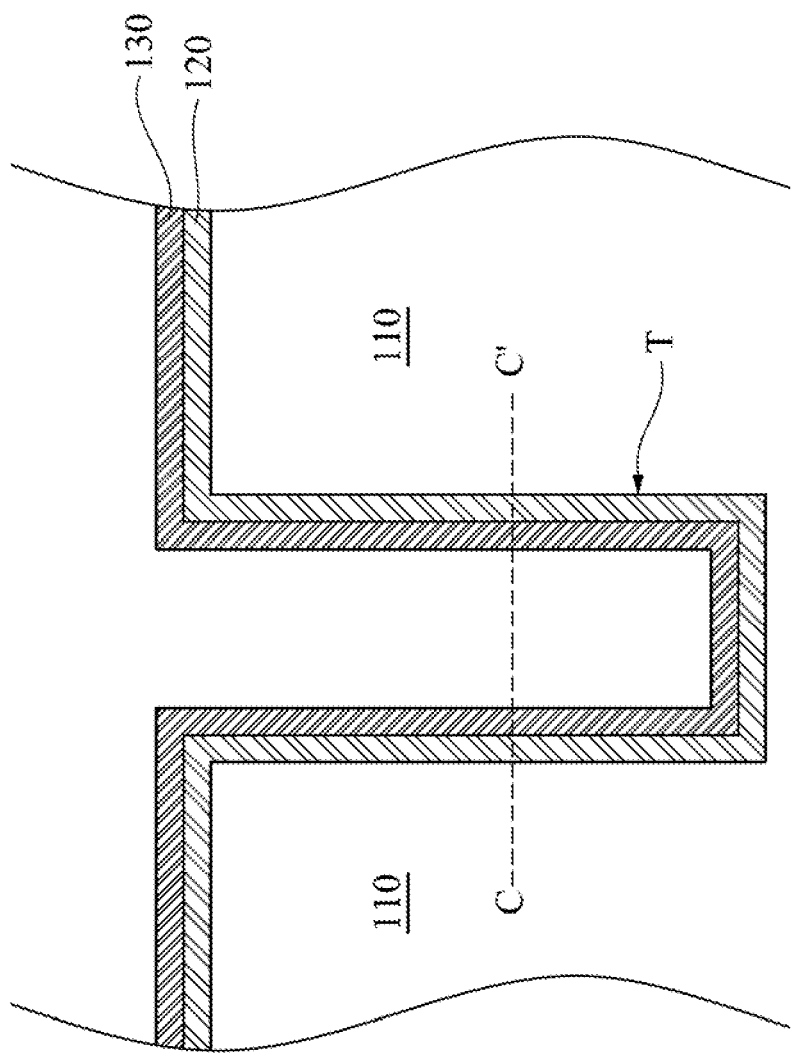
FIG. 6 is a cross-sectional view of an intermediate stage of manufacturing the semiconductor device in accordance with an embodiment of present disclosure.

Reference is made to FIG. 1 and FIG. 6. FIG. 6 is a cross-sectional view of an intermediate stage of manufacturing a semiconductor device 100 in accordance with an embodiment of the present disclosure. As shown in FIG. 6, the second semiconductor layer 130 is formed in step S12. Specifically, the second semiconductor layer 130 is deposited on the first semiconductor layer 120 which is formed on the inner surface of the trench T of the substrate 110. This ensures that the trench T is filled by the second semiconductor layer 130 during the depositing of step S12. In some embodiments, a dopant concentration of the first semiconductor layer 120 is less than a dopant concentration of the second semiconductor layer 130.

Figure 7:
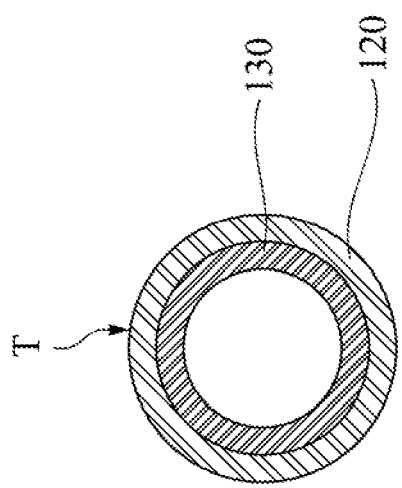
FIG. 7 is a cross-sectional view of an intermediate stage of manufacturing the semiconductor device in accordance with an embodiment of present disclosure.

Reference is made to FIG. 1 and FIG. 7. FIG. 7 is a cross-sectional view of an intermediate stage of manufacturing a semiconductor device 100 in accordance with an embodiment of present disclosure based on a section C-C' of FIG. 6. As shown in FIG. 7, an inner wall of the first semiconductor layer 120 is lined with the second semiconductor layer 130 with a ring shape (or, a donut shape) in the section C-C'. In some embodiments, the second semiconductor layer 130 is formed adjacent and concentric to the first semiconductor layer 120, such that the second semiconductor layer 130 is wrapped by the first semiconductor layer 120 in the section C-C', but the present disclosure is not limited thereto.

In some embodiments, the second semiconductor layer 130 is formed on the top surface of the substrate 110, as shown in FIG. 4, but the present disclosure is not limited thereto.

In some embodiments, the second semiconductor layer 130 may include a material, such as doped polysilicon. In some embodiments, the second semiconductor layer 130 may be phosphorous-doped polysilicon or any suitable material. For example, the material may include phosphorous-doped (for example, doped with phosphane ($PH_3$)) pure silane ($SiH_4$), disilane ($Si_2H_6$), dichlorosilane ($SiH_2Cl_2$), or the like. The present disclosure is not intended to limit the material of the second semiconductor layer 130.

In some embodiments, the second semiconductor layer 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second semiconductor layer 130.

In some embodiments, the second semiconductor layer 130 may be deposited by a blanket depositing process. The present disclosure is not intended to limit the methods of depositing the second semiconductor layer 130.

In step S14, a third semiconductor layer 140 is deposited on the second semiconductor layer 130 to fill the trench T of the substrate 110.

Reference is made to FIG. 1 and FIG. 8. FIG. 8 is a cross-sectional view of an intermediate stage of manufacturing a semiconductor device 100 in accordance with an embodiment of the present disclosure. As shown in FIG. 8, the third semiconductor layer 140 is formed in step S14. Specifically, the third semiconductor layer 140 is deposited on the second semiconductor layer 130 which is formed on the inner wall of the first semiconductor layer 120, such that the third semiconductor layer 140 fills the trench T. This ensures that the trench T is fully filled with the third semiconductor layer 140 during the depositing of step S14. In some embodiments, a dopant concentration of the third semiconductor layer 140 is less than the dopant concentration of the second semiconductor layer 130.

Reference is made to FIG. 1 and FIG. 9. FIG. 9 is a cross-sectional view of an intermediate stage of manufacturing a semiconductor device 100 in accordance with an embodiment of present disclosure based on a section D-D' of FIG. 8. As shown in FIG. 9, an inner wall of the second semiconductor layer 130 is lined with the third semiconductor layer 140 with a circular shape in the section D-D'. In some embodiments, the third semiconductor layer 140 is formed adjacent and concentric to the second semiconductor layer 130 and the first semiconductor layer 120, such that the third semiconductor layer 140 is wrapped by the second semiconductor layer 130 and the first semiconductor layer 120 wrapping the second semiconductor layer 130 in the section D-D'. In this way, the first semiconductor layer 120, the second semiconductor layer 130, and the third semiconductor layer 140 completely fill the trench T.

In some embodiments, the third semiconductor layer 140 is formed on the top surface of the substrate 110, as shown in FIG. 8, but the present disclosure is not limited thereto.

In some embodiments, a material of the third semiconductor layer 140 is identical to the material of the first semiconductor layer 120.

In some embodiments, the third semiconductor layer 140 may include a material, such as non-doped polysilicon. For example, the material may include pure silane ($SiH_4$), disilane ($Si_2H_6$), dichlorosilane ($SiH_2Cl_2$), or the like. However, any suitable material may be utilized.

In some embodiments, the third semiconductor layer 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the third semiconductor layer 140.

In some embodiments, the third semiconductor layer 140 may be deposited by a blanket depositing process. The present disclosure is not intended to limit the methods of depositing the third semiconductor layer 140.

By performing the method M shown in FIG. 1 of the present disclosure, the semiconductor device 100 with better electrical performance may be formed.

Figure 10:
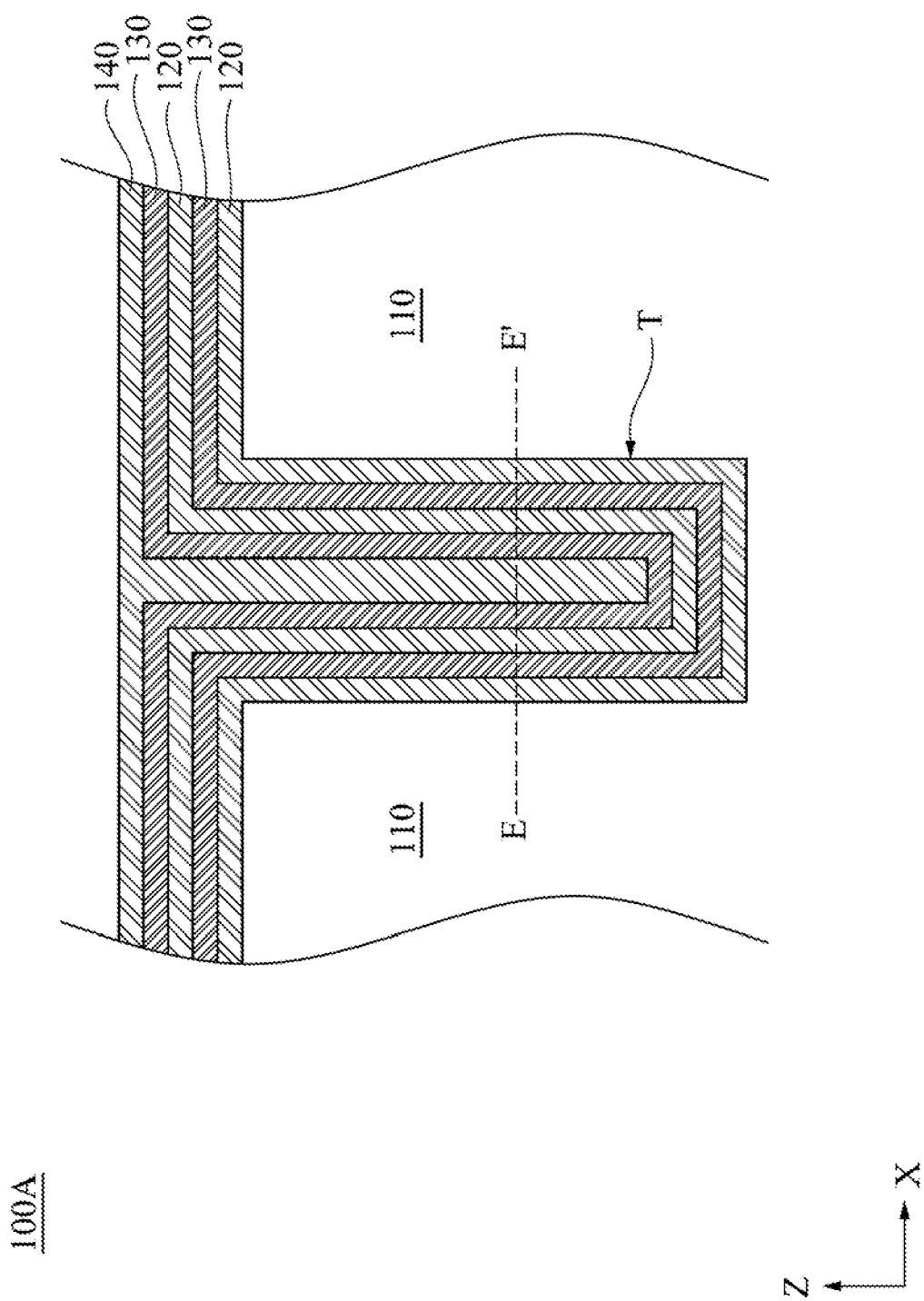
FIG. 10 is a cross-sectional view of an intermediate stage of manufacturing the semiconductor device in accordance with an embodiment of present disclosure.
Figure 11:
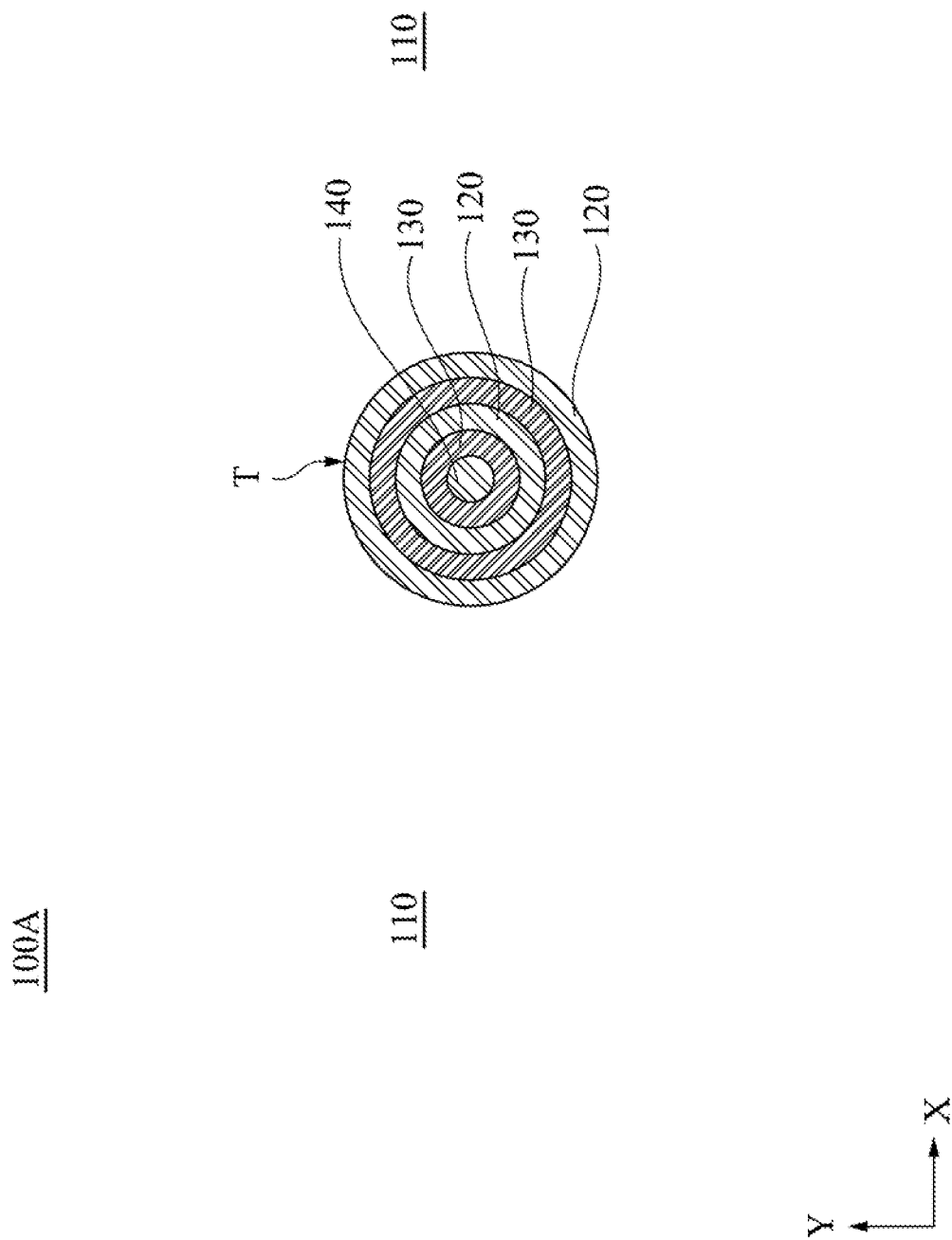
FIG. 11 is a cross-sectional view of an intermediate stage of manufacturing the semiconductor device in accordance with an embodiment of present disclosure.

Some other embodiments of the semiconductor device in the present disclosure are shown in below. FIG. 1 is a flow chart of a method M of manufacturing a semiconductor device 100A as shown in FIG. 10 and FIG. 11 in accordance with an embodiment of present disclosure, in which FIG. 11 is a cross-sectional view of an intermediate stage of manufacturing a semiconductor device 100A in accordance with an embodiment of present disclosure based on a section E-E' of FIG. 10. Please refer to FIG. 1, FIG. 2, FIG. 3, FIG. 4, and FIG. 5 for better understanding the step S10, refer to FIG. 1, FIG. 6, and FIG. 7 for better understanding the step S12, and refer to FIG. 1, FIG. 10, and FIG. 11 for better understanding the step S14.

Reference is made to FIG. 1, FIG. 2, and FIG. 3 again. In some other embodiments, the substrate 110 with the trench T is used as that of previous described, so the detail will not be described herein.

Reference is made to FIG. 4, FIG. 5, FIG. 6, FIG. 7, FIG. 10, and FIG. 11. In some other embodiments, step S10 and step S12 are still performed in the method M of manufacturing the semiconductor device 100A. The difference in steps between manufacturing the semiconductor device 100 and manufacturing the semiconductor device 100A is that step S10 and step S12 are iteratively performed in the manufacturing the semiconductor device 100A. For example, as shown in FIG. 10 and FIG. 11, the semiconductor device 100A includes two layers of the first semiconductor layer 120 and two layers of the second semiconductor layer 130, and each of the first semiconductor layers 120 and each of the second semiconductor layers 130 are respectively sandwiched between the second semiconductor layers 130 and the first semiconductor layers 120, but the present disclosure is not limited thereto.

In some other embodiments, the semiconductor device 100A may include more than two layers of the first semiconductor layer 120 and more than two layers of the second semiconductor layer 130. In other words, the first semiconductor layers 120 and the second semiconductor layers 130 may be deposited repeatedly and iteratively in the trench T of the substrate 110. As shown in FIG. 1, FIG. 10, and FIG. 11, the method M of manufacturing the semiconductor device 100A ends with step S14 that the third semiconductor layer 140 entirely fills the trench T of the substrate 110.

In some other embodiments, the method M of manufacturing the semiconductor device 100A offers advantages. One of the advantages is that since each of the first semiconductor layers 120 of the semiconductor device 100A is thinner than that of the semiconductor device 100, the time duration of each deposition steps may be reduced, such that the quality control of filled material may be more easily, thereby lowering the probability of poly seam generation.

In some other embodiments, the first semiconductor layer 120 of semiconductor device 100A may include a material, such as non-doped polysilicon. For example, the material may include pure silane ($SiH_4$), disilane ($Si_2H_6$), dichlorosilane ($SiH_2Cl_2$), or the like. However, any suitable material may be utilized.

In some other embodiments, the first semiconductor layer 120 of semiconductor device 100A may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first semiconductor layer 120 of the semiconductor device 100A.

In some other embodiments, the second semiconductor layer 130 of the semiconductor device 100A may include a material, such as doped polysilicon. In some embodiments, the second semiconductor layer 130 may be phosphorous-doped polysilicon or any suitable material. For example, the material may include phosphorous-doped (for example, doped with phosphane ($PH_3$)) silane ($SiH_4$), disilane ($Si_2H_6$), dichlorosilane ($SiH_2Cl_2$), or the like. The present disclosure is not intended to limit the material of the second semiconductor layer 130 of the semiconductor device 100A.

In some other embodiments, the second semiconductor layer 130 of the semiconductor device 100A may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second semiconductor layer 130 of the semiconductor device 100A.

In some other embodiments, a material of the third semiconductor layer 140 of the semiconductor device 100A is identical to the material of the first semiconductor layer 120 of the semiconductor device 100A.

In some other embodiments, the third semiconductor layer 140 of the semiconductor device 100A may include a material, such as non-doped polysilicon. For example, the material may include pure silane ($SiH_4$), disilane ($Si_2H_6$), dichlorosilane ($SiH_2Cl_2$), or the like. However, any suitable material may be utilized.

In some other embodiments, the third semiconductor layer 140 of the semiconductor device 100A may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the third semiconductor layer 140 of the semiconductor device 100A.

In some other embodiments, the first semiconductor layer 120, the second semiconductor layer 130, and the third semiconductor layer 140 of the semiconductor device 100A may be deposited by a blanket depositing process. The present disclosure is not intended to limit the methods of depositing the first semiconductor layer 120, the second semiconductor layer 130, and the third semiconductor layer 140 of the semiconductor device 100A.

Figure 12:
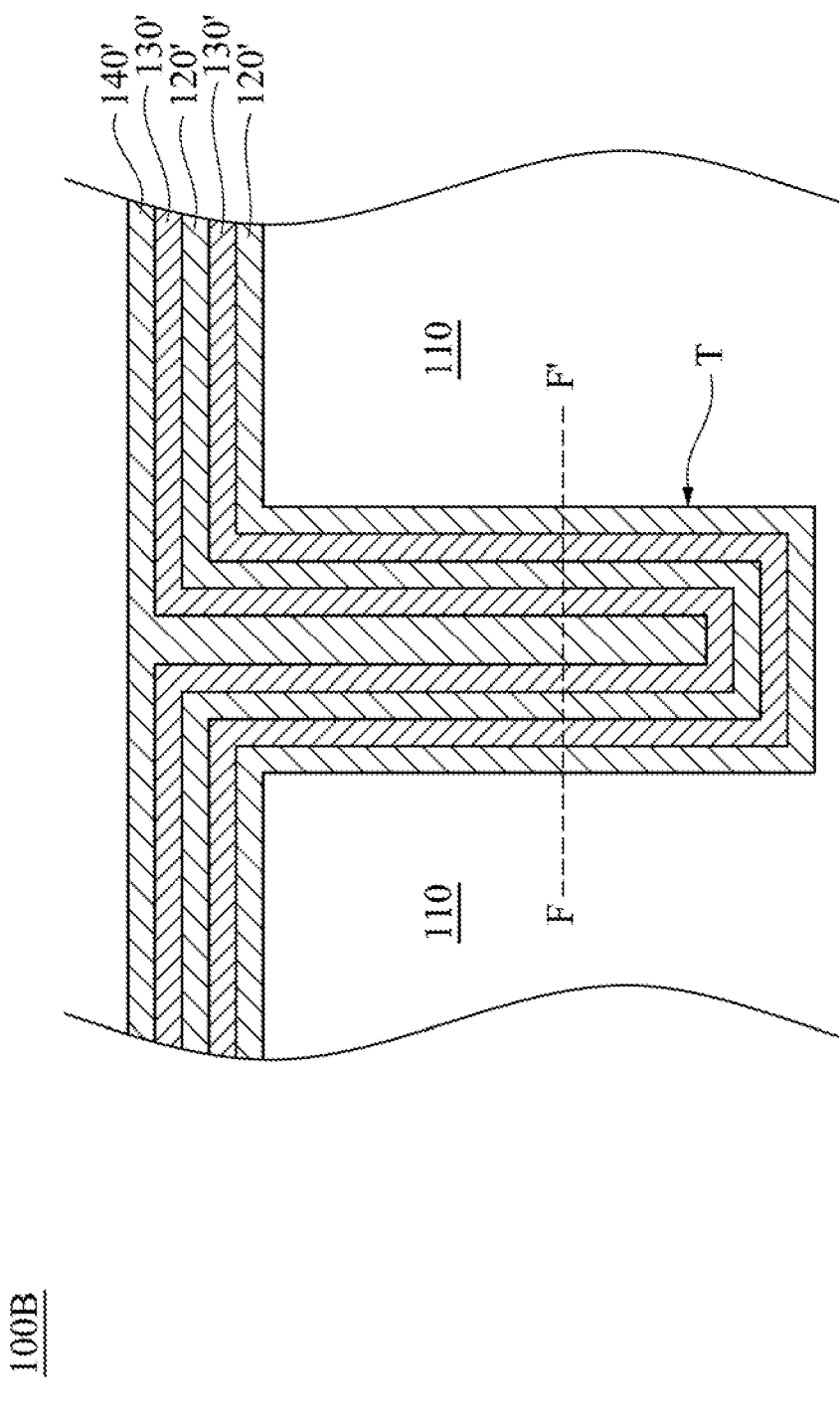
FIG. 12 is a cross-sectional view of an intermediate stage of manufacturing the semiconductor device in accordance with an embodiment of present disclosure.
Figure 13:
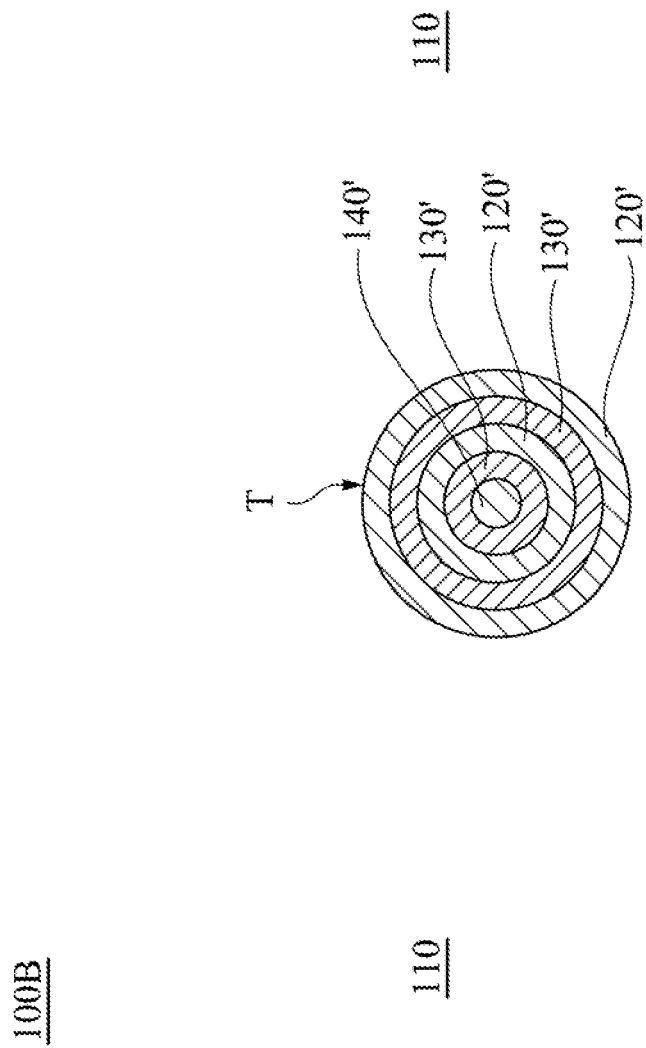
FIG. 13 is a cross-sectional view of an intermediate stage of manufacturing the semiconductor device in accordance with an embodiment of present disclosure.

Another embodiment of the semiconductor device in the present disclosure are shown in below. FIG. 1 is a flow chart of a method M of manufacturing a semiconductor device 100B as shown in FIG. 12 and FIG. 13 in accordance with an embodiment of present disclosure, in which FIG. 13 is a cross-sectional view of an intermediate stage of manufacturing a semiconductor device 100B in accordance with an embodiment of present disclosure based on a section F-F' of FIG. 12. Please refer to FIG. 1, FIG. 2, FIG. 3, FIG. 4, and FIG. 5 for better understanding the step S10, refer to FIG. 1, FIG. 6, and FIG. 7 for better understanding the step S12, and refer to FIG. 1, FIG. 12, and FIG. 13 for better understanding the step S14.

Reference is made to FIG. 1, FIG. 2, and FIG. 3 again. In some other embodiments, the substrate 110 with the trench T is used as that of previous described, so the detail will not be described herein.

Reference is made to FIG. 4, FIG. 5, FIG. 6, FIG. 7, FIG. 12, and FIG. 13. In some other embodiments, step S10 and step S12 are still performed in the method M of manufacturing the semiconductor device 1006. The difference in steps between manufacturing the semiconductor device 100A and manufacturing the semiconductor device 100B is that step S10, step S12, and step S14 of the method M of manufacturing the semiconductor device 100B respectively deposit the first semiconductor layer 120', the second semiconductor layer 130', and the third semiconductor layer 140'. For example, as shown in FIG. 12 and FIG. 13, the semiconductor device 100B includes two layers of the first semiconductor layer 120' and two layers of the second semiconductor layer 130', and each of the first semiconductor layers 120' and each of the second semiconductor layers 130' are respectively sandwiched between the second semiconductor layers 130' and the first semiconductor layers 120', but the present disclosure is not limited thereto.

In another embodiment, the semiconductor device 100B may include more than two layers of the first semiconductor layer 120' and more than two layers of the second semiconductor layer 130'. In other words, the first semiconductor layers 120' and the second semiconductor layers 130' may be deposited repeatedly and iteratively in the trench T of the substrate 110. As shown in FIG. 1, FIG. 12, and FIG. 13, the method M of manufacturing the semiconductor device 100B ends with step S14 that the third semiconductor layer 140' entirely fills the trench T of the substrate 110.

In another embodiment, the method M of manufacturing the semiconductor device 100B offers advantages. One of the advantages is that since each of the first semiconductor layers 120' of the semiconductor device 100B is thinner than that of the semiconductor device 100, the time duration of each deposition steps may be reduced, such that the quality control of filled material may be more easily, thereby lowering the probability of poly seam generation.

In another embodiment, the first semiconductor layer 120' of semiconductor device 100B may include a material, such as less-doped polysilicon. In some embodiments, the first semiconductor layer 120' may be less-phosphorous-doped polysilicon or any suitable material. For example, the material may include less-phosphorous-doped (for example, doped with phosphane ($PH_3$)) silane ($SiH_4$), disilane ($Si_2H_6$), dichlorosilane ($SiH_2Cl_2$) with a relatively low dopant concentration, or the like. However, any suitable material may be utilized.

In another embodiment, the first semiconductor layer 120' of semiconductor device 100B may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first semiconductor layer 120' of the semiconductor device 1008.

In another embodiment, the second semiconductor layer 130' of the semiconductor device 100B may include a material, such as highly-doped polysilicon. In some embodiments, the second semiconductor layer 130' may be highly-phosphorous-doped polysilicon or any suitable material. For example, the material may include highly-phosphorous-doped (for example, doped with phosphane ($PH_3$)) silane ($SiH_4$), disilane ($Si_2H_6$), dichlorosilane ($SiH_2Cl_2$), with a relatively high dopant concentration with respect to the first semiconductor layer 120', or the like. The present disclosure is not intended to limit the material of the second semiconductor layer 130' of the semiconductor device 1008.

In another embodiment, the second semiconductor layer 130' of the semiconductor device 100B may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second semiconductor layer 130' of the semiconductor device 1008.

In another embodiment, a material of the third semiconductor layer 140' of the semiconductor device 100B is identical to the material of the first semiconductor layer 120' of the semiconductor device 1008.

In another embodiment, the third semiconductor layer 140' of semiconductor device 100B may include a material, such as less-doped polysilicon. In some embodiments, the third semiconductor layer 140' may be less-phosphorous-doped polysilicon or any suitable material. For example, the material may include less-phosphorous-doped (for example, doped with phosphane ($PH_3$)) silane ($SiH_4$), disilane ($Si_2H_6$), dichlorosilane ($SiH_2Cl_2$) with a relatively low dopant concentration, or the like. However, any suitable material may be utilized.

In another embodiment, the third semiconductor layer 140' of the semiconductor device 100B may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the third semiconductor layer 140' of the semiconductor device 1008.

In another embodiment, the first semiconductor layer 120', the second semiconductor layer 130', and the third semiconductor layer 140' of the semiconductor device 100B may be deposited by a blanket depositing process. The present disclosure is not intended to limit the methods of depositing the first semiconductor layer 120', the second semiconductor layer 130', and the third semiconductor layer 140' of the semiconductor device 100B.

Based on the above discussions, it can be seen that the semiconductor device 100, the semiconductor device 100A, and the semiconductor device 100B of the present disclosure offers advantages. It is understood, however, that other embodiments may offer additional advantages, and not all advantages are necessarily disclosed herein, and that no particular advantages are required for all embodiments. One advantage is that since the steps of deposition to fill the trench are split into several steps, the time duration of process gas flow may be reduced, thereby lowering down the difficulty of the quality control of the filled material. Another advantage is that, for example, since each of the doped semiconductor layers is sandwiched between the non-doped semiconductor layers (or, sandwiched between the less-doped semiconductor layers), the poly seam that may be generated in doped semiconductor layers may be restricted in certain areas, thereby reducing the probability of generating poly void, and reducing resistivity and improving its electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:
    depositing a first semiconductor layer on an inner surface of a trench of a substrate;
    depositing a second semiconductor layer on the first semiconductor layer on the inner surface of the trench of the substrate, wherein a dopant concentration of the first semiconductor layer is less than a dopant concentration of the second semiconductor layer; and
    depositing a third semiconductor layer on the second semiconductor layer to fill the trench of the substrate, wherein a dopant concentration of the third semiconductor layer is less than the dopant concentration of the second semiconductor layer,
    wherein the depositing the first semiconductor layer and the depositing the second semiconductor layer are iteratively performed.

2. The method of claim 1, wherein a material of the third semiconductor layer is identical to a material of the first semiconductor layer.

3. The method of claim 1, wherein a material of the third semiconductor layer is different from a material of the second semiconductor layer.

4. The method of claim 1, wherein the depositing the third semiconductor layer is performed after the depositing the first semiconductor layer and the depositing the second semiconductor layer.

5. The method of claim 1, wherein the depositing the first semiconductor layer is performed by a blanket deposition process.

6. The method of claim 1, wherein a material of the first semiconductor layer comprises phosphorous-doped polysilicon.

7. The method of claim 1, wherein a material of the first semiconductor layer comprises non-doped polysilicon.

8. The method of claim 1, wherein the depositing the second semiconductor layer is performed by a blanket deposition process.

9. The method of claim 1, wherein a material of the second semiconductor layer comprises phosphorous-doped polysilicon.

10. The method of claim 1, wherein the depositing the third semiconductor layer is performed by a blanket deposition process.

11. The method of claim 1, wherein a material of the third semiconductor layer comprises phosphorous-doped polysilicon.

12. The method of claim 1, wherein a material of the third semiconductor layer comprises non-doped polysilicon.

13. A semiconductor device, comprising:
    a first semiconductor layer disposed on an inner surface of a trench of a substrate, wherein an aspect ratio of a depth to a width of the trench is greater than 1, and the width is less than 60 nanometers;
    a second semiconductor layer disposed on the first semiconductor layer in the inner surface of the trench of the substrate, wherein a dopant concentration of the first semiconductor layer is less than a dopant concentration of the second semiconductor layer; and
    a third semiconductor layer disposed on the second semiconductor layer, wherein a dopant concentration of the third semiconductor layer is less than the dopant concentration of the second semiconductor layer, and wherein the third semiconductor layer fully fills the trench of the substrate,
    wherein the first semiconductor layer and the second semiconductor layer are iteratively formed in the trench of the substrate.

14. The semiconductor device of claim 13, wherein a material of the first semiconductor layer and a material of the third semiconductor layer are identical.

15. The semiconductor device of claim 13, wherein a material of the second semiconductor layer is different from a material of the third semiconductor layer.

16. The semiconductor device of claim 13, wherein the first semiconductor layer, the second semiconductor layer, and the third semiconductor layer are concentrically arranged in the trench of the substrate in a top view.

17. The semiconductor device of claim 16, wherein the second semiconductor layer wraps the third semiconductor layer, and the first semiconductor layer wraps the second semiconductor layer and the third semiconductor layer.

18. The semiconductor device of claim 13, wherein a material of the first semiconductor layer and a material of the third semiconductor layer comprise non-doped polysilicon.

* * * * *